United States Patent
Grass

(10) Patent No.: US 6,430,096 B1
(45) Date of Patent: Aug. 6, 2002

(54) METHOD FOR TESTING A MEMORY DEVICE WITH REDUNDANCY

(75) Inventor: Anthony Erich Grass, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/703,768

(22) Filed: Nov. 1, 2000

(51) Int. Cl.$^7$ ................................................ G11C 7/00
(52) U.S. Cl. .................. 365/201; 365/230.01; 365/236; 365/230.06; 365/200
(58) Field of Search ........................ 365/189.01, 230.01, 365/230.06, 200, 201, 236

(56) References Cited

U.S. PATENT DOCUMENTS

| | | | |
|---|---|---|---|
| 5,473,616 A | | 12/1995 | Tsutsui et al. |
| 5,491,660 A | * | 2/1996 | Ashmore, Jr. .......... 365/230.02 |
| 5,535,164 A | * | 7/1996 | Adams et al. .............. 365/201 |
| 5,602,778 A | * | 2/1997 | Futatsuya et al. ....... 365/189.09 |
| 5,661,732 A | * | 8/1997 | Lo et al. ..................... 371/22.2 |
| 5,719,880 A | * | 2/1998 | Leung ....................... 371/22.5 |
| 5,796,745 A | | 8/1998 | Adams et al. |
| 5,835,502 A | | 11/1998 | Aipperspach et al. |
| 5,854,796 A | | 12/1998 | Sato |
| 5,896,398 A | | 4/1999 | Sekine |
| 5,930,814 A | | 7/1999 | Lepejian et al. |
| 6,172,935 B1 | * | 1/2001 | Wright et al. ............... 365/233 |
| 6,233,182 B1 | * | 5/2001 | Satou et al. ................. 365/200 |

FOREIGN PATENT DOCUMENTS

| | | | |
|---|---|---|---|
| JP | 406150698 A | * | 5/1994 |
| JP | 409062533 A | * | 3/1997 |
| JP | 02000132997 A | * | 5/2000 |

* cited by examiner

Primary Examiner—Viet Q. Nguyen
(74) Attorney, Agent, or Firm—Connolly Bove Lodge & Hutz LLP

(57) ABSTRACT

A method of accessing the memory elements in a packaged part, which has an internal address counter, N external lines for addressing a memory element, and ($2^N$+M) addressable memory elements. The access method comprising a step of causing the packaged part to enter a test mode in response to a first signal, a step of controlling the address counter in response to a second signal; and a step of accessing the memory element addressed by the output value of the address counter.

10 Claims, 1 Drawing Sheet

METHOD FOR TESTING A MEMORY DEVICE WITH REDUNDANCY

FIELD OF THE INVENTION

The present invention relates generally to a method of providing extended address access to memory devices containing both redundant and main array elements in a packaged part.

BACKGROUND OF THE INVENTION

The advent of electronic-fuse (e-fuse) technology makes it advantageous to test both the main and redundant memory elements of a random access memory (RAM), to their complete test specification, after being packaged in their final form. However, memory device, package pin counts and JDEC standards limit the externally addressable memory elements to those comprising the main array. These limitations make it impossible to seamlessly test both the main and redundancy arrays of an e-fuse RAM, once the memory device has been packaged, through the conventional method of externally addressing all of the memory elements in sequence and testing their ability to store and reproduce information.

Current test schemes use a two-pass, test method to independently and separately test the redundant and main memory arrays. This two-pass, test technique cannot adequately test the combined memory arrays for certain types of memory defects that occur at the boundary of the main and redundant arrays. Capacitive coupling and current leakage between elements of a memory array are two examples of these defects. To adequately detect these and other types of defects, it is necessary to sequentially address each of the cells of a memory device and perform a sequence of write and read operations on the cell. The sequential access of these memory cells must be performed throughout the continuum of the combined main and redundancy arrays.

SUMMARY OF THE INVENTION

In the past, the problem of extended address mode access has been dealt with by adding additional, external address input pins to a packaged part, by executing two pass testing, or by extensively modifying the test code of a test unit to address the redundant memory elements. The present invention supports extended address mode access of the main and redundant memory arrays, contained in a packaged part, without using additional, external address pins or extensively modifying the existing code of a test device.

The access method of the present invention will be especially valuable in the era of e-fuse repair devices. E-fuse technology allows memory defects to be repaired after the memory device has been incorporated into a packaged part. Previously, the boundary element defects that might exist in a memory device could only be detected prior to integrating the memory wafer into a packaged part. At wafer level, there are no package pin limitations. It is possible to seamlessly address and test all of the memory elements of the device because a wafer probe can make contact with all of the address pads of the memory chip.

The access method of the present invention permits all of the memory elements to be seamlessly addressed and accessed while in a packaged part form. In an embodiment of the invention, a test method is used for testing the memory elements of a device. Consistency in the test methodology between a wafer environment and a packaged part environment may be preserved, since all of the memory elements may be seamlessly and sequentially addressed and tested in both test environments. Certain defects that may exist at the boundary of the main and redundant memory arrays can be detected and effectively removed from the finished product. The value of this test method is that it: (1) reduces the likelihood that a defective device will not be detected by the post-packaging testing, (2) increases the productivity yield, and (3) reduces the production costs for manufacturing a particular yield of operational devices. These benefits are obtained without the need for incorporating additional address input lines in the packaged part or extensively modifying the code of a test unit.

BRIEF DESCRIPTION OF THE DRAWING

The above and other objects, features, and advantages of the present invention will become more apparent from the following detailed description of the preferred embodiment of the invention that is to be read in conjunction with the accompanying drawing, in which:

The figure provides a functional block diagram of the preferred device for implementing the test method of this invention.

DETAILED DESCRIPTION OF THE INVENTION

Figure 1:
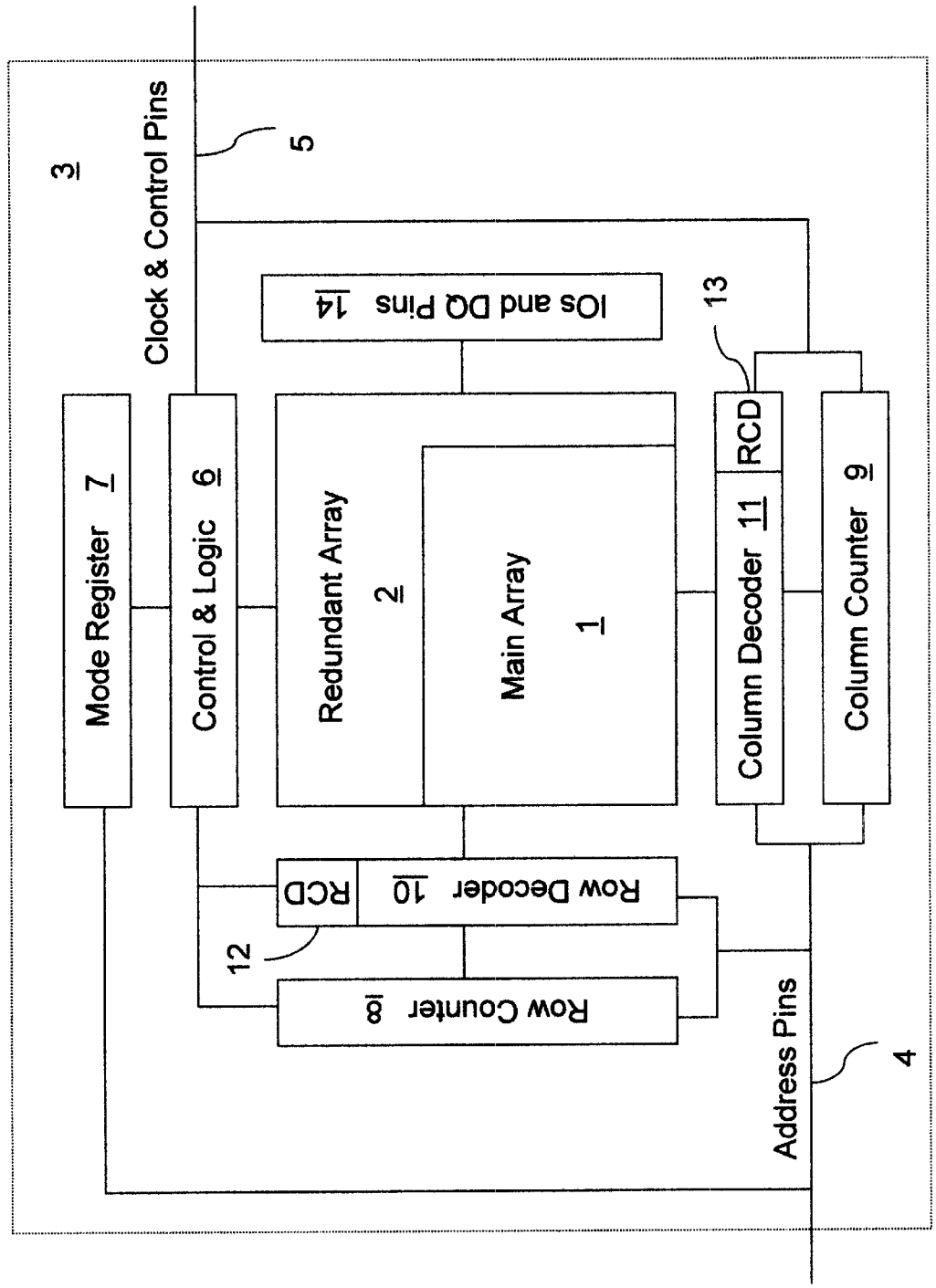

The preferred embodiment of the invention will be described hereinafter to exemplify how the above-described problem may be overcome by a method that uses a tester-controlled counter to seamlessly address all of the row and column addresses of the combined main and redundant memory arrays 1 and 2, respectively. These memory arrays and the functional logic that is integrated into the packaged part, for implementing the test method presented by this embodiment, are illustrated in the figure. The combined memory arrays have $2^N+M$ addressable memory elements, where N is the number of external address pins 4, N and M are positive integers, and M is greater than 0.

A first test mode is initiated by providing a specific sequence of four commands to the packaged part 3. Three of these commands operate as a keying sequence to prevent the inadvertent activation of this, or any subsequent, test mode. Each command comprises the application of address information to address pins 4 and control signals to pins 5 when the clock signal, also on pins 5, transitions between states to register the command. Table 1 tabulates an exemplary sequence of commands that may be used to initiate the test sequence. The first command comprises the application of address 1A1 (hexadecimal) to pins 4 and a logical-true state to the row address select (RAS), column address select (CAS), write enable (WE), output enable (OE), and clock signal lines of pins 5. Similarly, the second command comprises the application of address 1DF and a logical-true state to the RAS, CAS, WE, OE, and clock signal lines. Next, the address of the particular test mode to be executed is entered by applying the address information XXX and a logical-true state to the indicated signal lines, where XXX is a three digit, hexadecimal representation of the starting address for the test mode. Applying 1AB to address pins 4 and the indicated clock and control signals to pins 5 activates the selected, first test mode. Control and logic device 6, mode register 7, row and column counters 8 and 9, row and column decoders 10 and 11, and main memory array 1 cooperate to initiate the test mode.

TABLE 1

Test Mode Activation Sequence

| Step | Address | Clock and Control Signals | Activity Description |
|---|---|---|---|
| 1 | 1A1 | RAS, CAS, WE, OE, AND CLOCK | First command |
| 2 | 1DF | RAS, CAS, WE, OE, AND CLOCK | Entry of second command |
| 3 | XXX | RAS, CAS, WE, OE, AND CLOCK | Select test mode |
| 4 | 1AB | RAS, CAS, WE, OE, AND CLOCK | Test mode activated |

Upon entering the first test mode, the starting row and column addresses, the maximum and minimum row and column address values, and the value for incrementing the row and column address counters 8, 9 are set. These parameter values are set by a means known in the art, but the particular means used could include: (1) setting the parameters to default values, (2) employing an additional step in the test mode initiating sequence to set the values, and (3) obtaining values from the mode register 7. Since a particular test mode may be selected by a unique address in step 3, of the first test mode activation sequence, numerous test modes may be stored to a memory location. Each test mode may have its pre-programmed set of starting row and column addresses, maximum and minimum row and column address values, and values for incrementing the row and column address counters 8, 9.

Next, a second test mode is entered that allows the on-chip row and column counters 8 and 9, respectively, to be controlled by an operation code (op-code) that is applied to address pins 4. This second test mode is initiated by executing the sequence of steps listed in Table 1, though the address information may differ. While in this second test mode, all of the memory elements, in both the main and redundant arrays 1 and 2, may be seamlessly addressed and tested.

Access to the individual cells of the memory device under test is controlled by means of an op-code, instead of providing the complete address through address pins 4. The op-codes are listed in Tables 2 and 3.

Referring now to Table 2, each memory cell of a synchronous, dynamic, random access, memory (SDRAM) device may be tested for defects using this test method. During a bank activate, command cycle, the state of the SDRAM address pins A0–A2, of pins 4, may be latched on the transitioning edge of a clock cycle. The values of the latched bits determine whether the on-chip row counter 8 is to be incremented, decremented, or left at its current value. Table 2 provides an example of the relationship between the values placed on address pins A0–A2 and the subsequent operation performed by the SDRAM. Similarly, during a read or write command cycle, the state of address pins A0–A1, of pins 4, may be latched to determine if the on-chip column counter 9 is to be incremented, decremented, or held constant. Table 3 illustrates the command logic controlled by address lines A0 and A1 during a read or write command cycle.

TABLE 2

Bank Activate Command Cycle

| A2 | A1 | A0 | Op-Code/Counter Command |
|---|---|---|---|
| 0 | 0 | 0 | Hold current value |
| 0 | 0 | 1 | Increment row count |
| 0 | 1 | 0 | Decrement row count |
| 1 | 0 | 1 | Increment bank count |
| 1 | 1 | 0 | Decrement bank count |

TABLE 3

Read and Write Command Cycle

| A1 | A0 | Op-Code/Counter Command |
|---|---|---|
| 0 | 0 | Hold current value |
| 0 | 1 | Increment column count |
| 1 | 0 | Decrement column count |

To test every element of the combined main and redundant memory arrays 1 and 2, the row and column addresses may be set to their minimum value. Additionally, the maximum and minimum row and column address values may be set to cover the entire range of memory addresses and the value for incrementing the row and column address counters 8, 9 may be set to one. Thereafter, the minimum row and column addresses may be loaded into the row and column counters 8 and 9, respectively. Row decoder 10 and redundant row decoder 12 decode the counter value stored in row counter 8. Column decoder 9 and redundant column decoder 13 decode the counter value stored in column counter 9. Together, decoders 9, 10, 11, and 12 select a memory address from the combined memory arrays 1 and 2. Read and write operations may be conducted on the selected memory element by the particular combination of values placed on the RAS, CAS, WE, OE, and clock (CLK) signal lines. A value to be written to a memory element is placed on the proper signal line, of the data input and output lines 14, coincident with the signals indicating a write operation. Similarly, a value to read from a memory element is placed on the proper signal line, of the data input and output lines 14, coincident with the signals indicating a read operation.

A memory cell is tested by sequentially writing a value to the cell and reading the value stored in the cell, one or more times, and comparing the written and read values to determine if they match. If the sequentially written and read values do not match in one or more of the writing and reading sequences, the memory cell may be defective. The address of the defective memory cell is stored to a memory device for later retrieval. After the first memory element is tested, one of the counters 8 and 9 is incremented. For example, the row counter may be incremented by the incrementing value of one, in this example. The memory element in this next row, having the same column address as the previously tested memory element, is then functionally tested. This sequence of incrementing the row counter 8 and testing the memory element in the next row, having the same column address as the memory element previously tested, is continued until the row counter 8 reaches the maximum row address. Then, the row counter 8 is reset to its minimum row address and the column counter 9 is incremented by the incrementing value of one, for this example. The memory elements of every row having the column address represented by the column counter 9 are tested according to the process, described above, for testing the memory elements of every row having the first column address. Once the memory elements of every row having this current column address are tested, the row counter 8 is again reset, again, the column counter 9 is incremented, and the memory elements of every row having the next column address are tested. The process of resetting the row counter 8 to its minimum value, incrementing the column counter 9, and testing the memory element of every row having the same column address is continued until the maximum column address is reached.

Because the maximum number of addressable row and column elements are not constrained by the number of pins on the package, the combined main and redundant memory arrays 1 and 2 can be sequentially and seamlessly addressed and tested. The sequential access of these memory cells is performed throughout the continuum of the combined main 1 and redundant 2 arrays in a single test process. Thus, the defective cells of a memory device, whether at the boundary of the memory arrays or elsewhere, may be detected and replaced by cells from the redundant memory array 2, after the memory device has been integrated into a packaged part.

Exiting the test mode is accomplished by sequentially applying a CAS command and then a RAS command to the packaged part 3. This sequence of commands is referred to as a CBR command and has been chosen for use as the exit command since it has a complementary purpose. When an SDRAM device is powered up, it will sometimes inadvertently enter an unintended operational state. Since all SDRAM parts used in a system will typically receive a CBR command every 64 ms to place the device in a known state, the CBR command is well suited to restore the SDRAM from a test mode to its normal mode of operation.

Although the preferred embodiment of the invention has been described in relation to using two counters, one each for counting the row and column values, it is possible to use a single counter to achieve the same result. Deciding whether to use one counter or two depends upon an engineering trade-off. The trade-off is between chip area and complexity. If the designer has sufficient chip area, the two-counter method is simpler to implement. If there is insufficient chip area for two counters, a single counter may be used. When a single counter is used, its use must be multiplexed between providing the row and column addresses. As a result, the single counter implementation is more complex because it requires one or more registers to store the inactive row or column address as the counter is multiplexed between supplying the row and column addresses.

One means for performing the test method described above may be accomplished by connecting an external test device (not shown) to the packaged part 3. This test device provides the address information to address pins 4 and the clock and control signals to pins 5. Additionally, it provides the values to be written to the memory elements on pins 14 and read the values written to these pins by the packaged part 3. By comparing the values written to and read from a memory element, the test device determines which memory elements are defective. The test device stores these addresses to memory until the entire test process is completed. Thereafter, the test device rewires the packaged part, by means known in the art, to substitute an operational memory element for a defective memory element. After the rewiring, the substituted memory element is accessed by the same address used to access the defective memory element before the rewiring step was executed. In this way, functional memory elements from the redundant array 2 may be substituted for defective memory elements of the main array 1. Such a test device may execute the entire method, described herein, for testing the memory elements of a packaged part 3 either with manual intervention by an operator or by an automated means that is known in the art.

The foregoing description of the preferred embodiment illustrates and describes the present invention. Additionally, the disclosure shows and describes only the preferred embodiments of the invention but, as mentioned above, it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A method for accessing memory elements of a main memory portion and a redundant memory portion of a packaged component having a fixed number N of external lines for addressing ($2^N$+M) elements, where M and N are positive integers greater than 0, comprising:

enabling test circuitry on said packaged component to enter one of a plurality of test modes in response to a first test mode identifying signal applied to said external lines;

enabling an internal address counter of said packaged component in response to a second signal applied to said external lines; and accessing each of said memory elements of said main memory portion and said redundant memory portion with said internal counter so that each of said memory elements can be tested with said test circuitry, whereby defects existing in memory elements comprising boundary elements between said main and redundant memory portion may be detected.

2. The method of claim 11, further comprising:

a step of storing a value to the accessed memory element; and a step of retrieving the value stored to the accessed memory element.

3. The method of claim 2, further comprising:

a step of comparing the stored and retrieved values to determine whether the accessed memory element is defective.

4. The method of claim 3, further comprising:

a step of rewiring the packaged part to substitute an operational memory element for a defective memory element, wherein the substituted memory element is accessed, after the rewiring, by the same address used to access the defective memory element before the rewiring step was executed.

5. The method of claim 11, wherein:

a test device, connected to a subset of said external lines, generates said second signal.

6. The method of claim 11, wherein:

the output value of said address counter may be incremented, decremented, or held constant, in response to said second signal.

7. The method of claim 11, wherein:

said package part is an integrated circuit comprising a synchronous, dynamic, random access memory.

8. The method of claim 11, wherein:

all of said ($2^N$+M) addressable memory elements are sequentially tested, according to the latter two steps of claim 11, once said test mode has been entered.

9. The method of claim 11, wherein:

said ($2^N$+M) addressable memory elements are configured as a multi-dimensional array and said addressable memory elements corresponding to each dimension can be individually tested according to the latter two steps of claim 11.

10. The method of claim 9, wherein:

each dimension of said multi-dimensional memory array has a corresponding address counter and the output value of each of said address counters may be independently incremented, decremented, or held constant, in response to said second signal.

* * * * *